United States Patent [19]
Goto et al.

[11] Patent Number: 5,324,916
[45] Date of Patent: Jun. 28, 1994

[54] SYSTEM AND METHOD FOR DYNAMIC POWER COMPENSATION

[75] Inventors: Masaharu Goto, Hanno, Japan; Christopher Koerner, Fort Collins, Colo.

[73] Assignee: Hewlett-Packard Company, Palo Alto, Calif.

[21] Appl. No.: 786,655

[22] Filed: Nov. 1, 1991

[51] Int. Cl.$^5$ ............................ H05B 1/02; H05B 1/00
[52] U.S. Cl. ..................................... 219/497; 219/508; 219/501; 219/210; 310/315; 331/176
[58] Field of Search ............... 219/209, 210, 497, 501, 219/508, 509, 499; 310/315, 346; 331/176, 66

[56] References Cited

U.S. PATENT DOCUMENTS

| | | | |
|---|---|---|---|
| 4,284,872 | 8/1981 | Graeme | 219/121 LB |
| 4,593,258 | 6/1986 | Block | 219/210 |

FOREIGN PATENT DOCUMENTS 0067752 12/1982 European Pat. Off. .

OTHER PUBLICATIONS

Patent Abstracts of Japan, vol. 6, No. 218 (E139) (1096) Nov. 2, 1982 & JP-A-57 121 268.
Patent Abstracts of Japan, vol. 11, No. 273 (C-445) (2720) Sep. 4, 1987 & JP-A-62 074 457.
Patent Abstracts of Japan, vol. 9, No. 318 (E-366) (2041) Dec. 13, 1985 & JP-A-60 152 045.

*Primary Examiner*—Mark H. Paschall

[57] ABSTRACT

A system and method for compensating in real time the dynamic power variation of a computer chip containing CMOS devices is provided. The present invention functions to control the temperature variations on the chip thus eliminating the drift to analog signals associated with CMOS devices. The present invention controls the temperature with the use of a compensation heater located on the CMOS chip. The compensation heater is driven by a plurality of signals which act in harmony with one another to control the temperature on the chip when it becomes unstable. The system and method includes driving the compensation heater with a maximum dynamic power value to effectively maintain the temperature on the chip, evaluating the chip for temperature fluctuation, and compensating for the temperature fluctuation by driving the compensation heater with at least one compensation power value.

29 Claims, 6 Drawing Sheets

SYSTEM AND METHOD FOR DYNAMIC POWER COMPENSATION

BACKGROUND OF THE INVENTION

1. Field of the Invention

The present invention relates generally to an apparatus and method for controlling the temperature on a computer chip containing CMOS devices by performing real time dynamic power compensation.

2. Discussion of Related Art

Complementary metal-oxide semiconductors (CMOS) technology is well known. CMOS devices employ integrated field-effect transistors in a complimentary symmetry arrangement, which simulates a "push/pull" operation because of the placement of opposing-polarity devices (i.e., p-channel and n-channel FETs). CMOS technology has a variety of advantages over other MOS devices, including lower power requirements, superior noise immunity, higher fanout, higher tolerance to power supply variations, and higher temperature range.

Computer chips containing CMOS devices include time verniers which requires precise timing accuracy. Dynamic power variation of digital circuitry is an important issue in designing analog functions utilizing CMOS devices. The dynamic power variation changes chip temperature and it gives significant drift to the analog signal. Specifically, timing or propagation delay can be seriously impaired by the dynamic power variation. Propagation delay is affected by three parameters: capacitive loading, supply voltage, and temperature. Propagation delay is a function of ambient temperature. The temperature dependence of CMOS is much simpler than with TTL. In CMOS devices the carrier mobility changes, thus increasing the impedance and hence the delay with temperature. Consequently, it is an essential goal for the design of chips with precise time delay utilizing CMOS devices to control chip temperature.

Previously, there were primarily two techniques for controlling the temperature on a CMOS chip. First was the use of techniques which utilized a process which was relatively insensitive to clock frequency variation, such as bipolar processes. A significant drawback of this type of approach was the inherent high power consumption. A second technique tried to maintain low temperature gradients from the silicon to ambient temperature. By limiting the temperature gradients the effects of on chip heating could be minimized. However, although such on chip heating was minimized, it was not eliminated. Traditionally, low temperature gradients were achieved by expensive packaging techniques or the utilization of water cooling systems. Both these techniques added additional cost to the system.

BRIEF DESCRIPTION OF THE INVENTION

To overcome the limitations of the conventional approaches in controlling the temperature on a computer chip containing CMOS devices, real time dynamic power compensation has been implemented. The dynamic power compensation system of the present invention functions to control the temperature variations on the chip thus eliminating the drift to analog signals associated with CMOS devices. The present invention controls the temperature with the use of a compensation heater located on the chip. The compensation heater is driven by a plurality of heater control signals which act in harmony with one another to control the temperature on the chip when it becomes unstable. The heater control signals are a function of the system clocks' dependent power. The clocks' dependent power is the amount of power dissipated in the chip by the circuitry associated with the clocks.

The system and method of controlling the temperature on the CMOS chip includes driving the compensation heater with a maximum dynamic power value to effectively maintain the temperature on the chip, evaluating the chip for temperature fluctuation, and compensating for the temperature fluctuation by driving the compensation heater with at least one compensation power value. In contrast to conventional approaches, the present invention does not require high power compensation, expensive packages, or expensive cooling systems. The only requirement is a small amount of additional silicon area.

The preferred embodiment of the present invention includes a compensation heater, which is driven by three heater control information values, and a pair of clocks. The three heater control information values are a function of the two clocks. First and second input control signals having first and second states are produced depending upon the on/off status of the clocks. Control of the compensation heater is a function of the first and second input control signals. When the first input control signal is in its first state only, the first heater control information signal is provided to the heater; when the first input control signal is in its second state and the second input control signal is in its first state, only the second heater control information signal is provided to the heater; and when the first input control signal is in its second state and the second input control signal is in its second state, only a combination of the second and third heater control information signals is provided to the heater.

BRIEF DESCRIPTION OF THE DRAWINGS

The foregoing and other objects, features and advantages of the invention will be apparent from the following more particular description of the preferred embodiments of the invention, as illustrated in the accompanying drawings in which.

DESCRIPTION OF THE PREFERRED EMBODIMENTS

Figure 1:
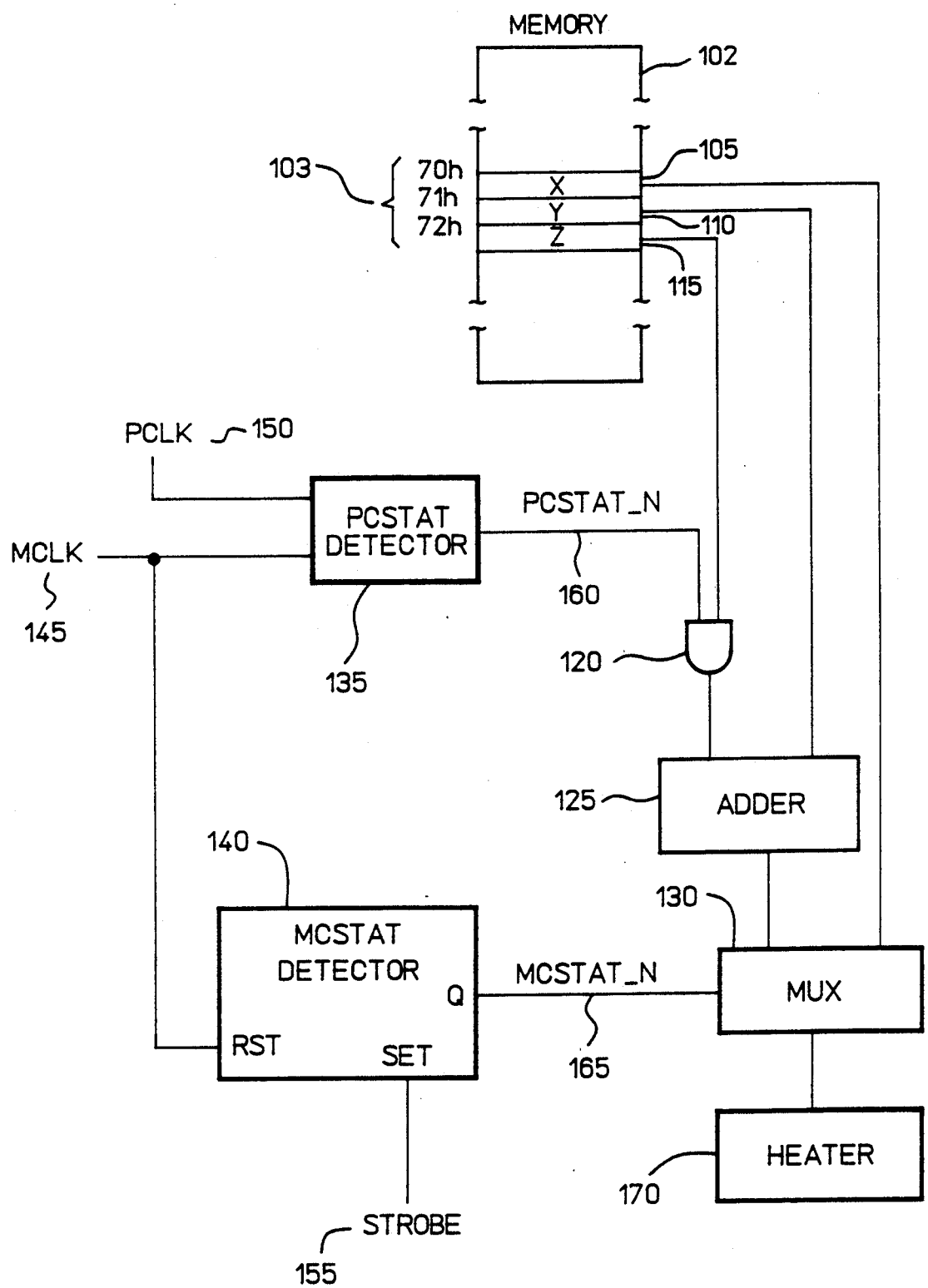
FIG. 1 shows a hardware representation of the Dynamic power compensation scheme of the present invention.

Referring to FIG. 1, a dynamic power compensation system 100 of the present invention is shown. The dynamic power compensation system 100 is located on a chip containing a plurality of CMOS devices. The system 100 contains a memory device 102 which is housed on the CMOS chip. The system 100 utilizes three registers 105, 110 and 115 located in memory 102, a six (6) bit adder 125, a six (6) bit gate circuit 120, a six (6) bit multiplexor, a SR-Latch 140, a state machine 135, and a six (6) bit compensation heater 170. The temperature on the chip is controlled by monitoring a Master Clock (MCLK) 145 and a Period Clock (PCLK) 150.

There are primarily three heater control information values that the dynamic power compensation system 100 utilizes. As indicated in FIG. 1, the three values are stored in registers labeled X 105, Y 110, and Z 115. The temperature on the chip can be maintained in a static condition by providing one of these values or a combination of these values as an input to the compensation heater 170. The MCLK 145 and PCLK 150 are used, as described below, to switch the compensation heater 170 input between the variables X, Y, and Y+Z.

Master clock dependent power is the amount of power dissipated in the chip by the circuitry associated with the MCLK 145. The Y value compensates for the power not generated by the MCLK 145 alone. As the MCLK 145 frequency increases the amount of master clock dependent power increases and the Y register 110 should be set to a smaller value. As the MCLK 145 frequency approaches its maximum frequency, the chip no longer needs to compensate for lost power. Therefore, to maintain constant power, the Y value approaches zero. Period clock dependent power is the amount of power dissipated in the chip by the circuitry associated with the PCLK 150. The Z value compensates for the power not generated by the PCLK 150 alone. As the PCLK 150 frequency increases the amount of period clock dependent power increases. The dynamic power compensation system 100 automatically detects the PCLK 150 frequency and decreases the Z portion of heater power.

The X register is set to a maximum dynamic power value (which is the sum of maximum master clock dependent power and maximum period clock dependent power). The maximum frequency value for the MCLK 145 in the preferred embodiment of the present invention is $F_{mc}=F_{mcmax}=128$ MHz. The maximum frequency value for the PCLK 150 in the preferred embodiment is $F_{pc}=F_{pcmax}=32$ MHz (i.e., one fourth of the maximum MCLK frequency). $F_{mc}$ and $F_{pc}$ represent the general frequency of the MCLK 145 and PCLK 150, respectively; while $F_{mcmax}$ and $F_{pcmax}$ represents the maximum frequency of the MCLK 145 and PCLK 150, respectively.

In the preferred embodiment the X register 105 is located at address 70$h$ of memory device 102. The value located in register X 105 is used to control the compensation heater 170 when MCLK 145 and PCLK 150 are in a static state. The X value is defined as:

$$X = P_{pcmax} + P_{mcmax} \quad (1)$$

where $P_{pcmax}$ is the period clock dependent power at PCLK frequency $F_{pc}=32$ MHz$=F_{pcmax}$ and $P_{mcmax}$ is the master clock dependent power at MCLK frequency $F_{mc}=128$ MHz$=F_{mcmax}$.

The Y and Z values are located at addresses 71$h$ and 72$h$ of the preferred embodiment of memory device 102. The system should set appropriate Y and Z values while MCLK 145 is not running. Registers Y 110 and Z 115 are set to compensation power values. When the chip temperature becomes unstable because of changes in the MCLK 145 or PCLK 150 frequency, the analog signals (e.g., timing) begin to drift. By using the values located in register Y 110 and register Z 115, the system can compensate for the temperature change. Register Y 110 is set to a compliment of the master clock dependent power and the maximum period clock dependent power at a particular MCLK 145 frequency. The Y value is defined as a function of MCLK 145 frequency as follows:

$$Y = X \frac{F_{mcmax} - F_{mc}}{F_{mcmax}} = (P_{pcmax} + P_{mcmax}) \frac{F_{mcmax} - F(k)}{F_{mcmax}}$$

Register Z 115 is set to a maximum of period clock dependent power at a certain MCLK 145 frequency. The Z value is also defined as a function of MCLK 145 frequency as follows:

$$Z = Z_{pcmax} \frac{F_{mc}}{F_{mcmax}} = P_{pcmax} \frac{F_{mc}}{F_{mcmax}} \quad (3)$$

$Z_{pcmax}=P_{pcmax}$ is a constant which should be defined during the chip characterization process. The chip is characterized with respect to its analog performance by checked the silicon for variation in skew for various MCLK 145 and PCLK 150 frequencies. When $Z=Z_{pcmax}$ and $P_{pc}=0$, Z heater power dissipation should be equal to period clock dependent power at $F_{mc}=F_{mcmax}=128$ MHz and $F_{pc}=F_{pcmax}=F_{mcmax}/4=32$ MHz.

Since the dynamic power is proportional to the operating frequency, dynamic power of the chip is defined as:

$$P_{mcdyn} = P_{mcmax} \frac{F_{mc}}{F_{mcmax}} \quad (4)$$

Therefore, the sum of the dynamic power and compensation power is:

$$P_{mcdyn} + Y + Z = P_{pcmax} + P_{mcmax} = X \quad (5)$$

Figure 7:
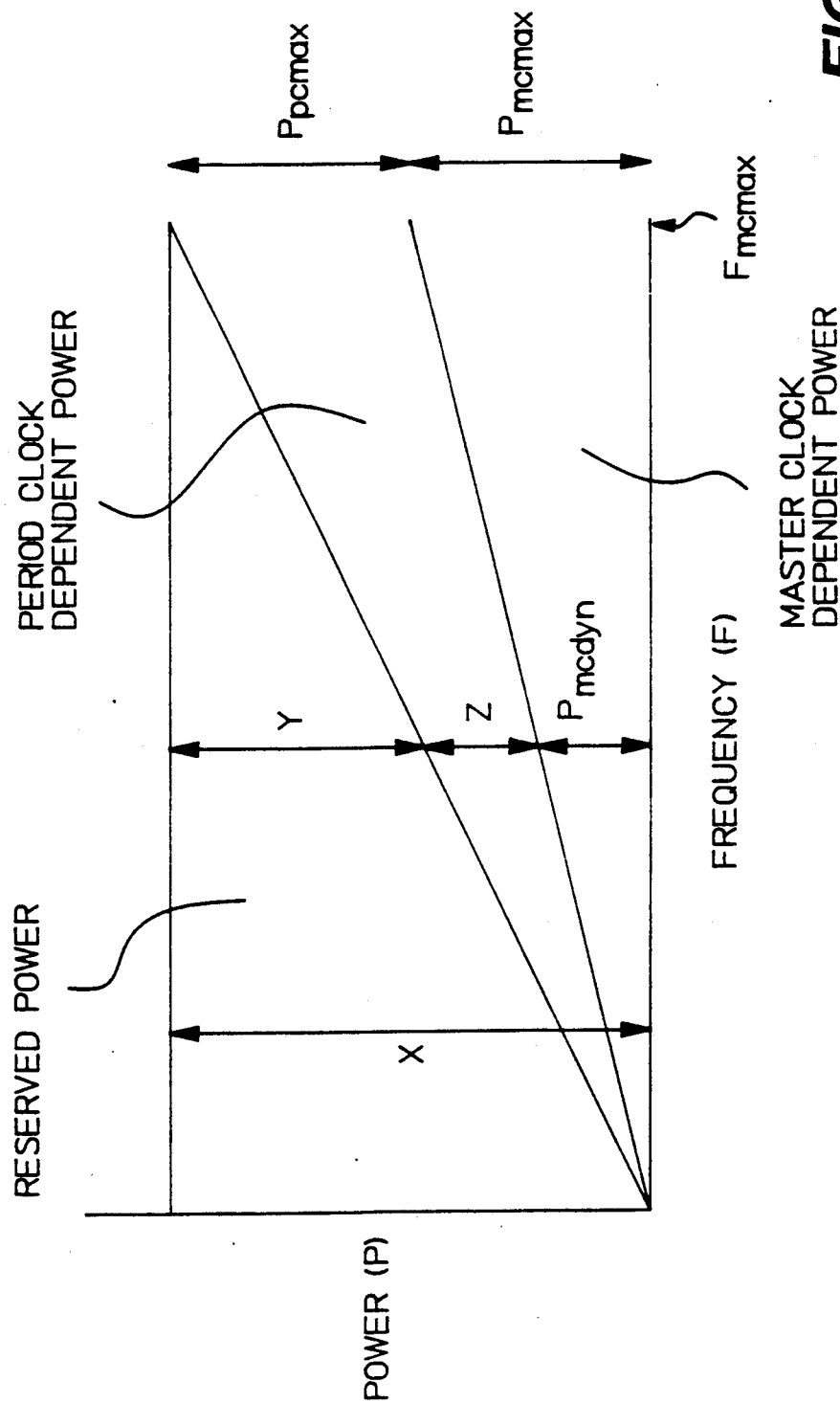
FIG. 7 shows a dynamic power compensation chart for the present invention.

All the equations set forth above are readily apparent with reference to FIG. 7, which shows a graph illustrating the relationships of the variables in the dynamic power compensation system 100.

MCLK 145 and PCLK 150 control the operation of the dynamic compensation system 100. MCSTAT detector 140 determines whether the MCLK 145 is on or off. The MCSTAT detector 140 of the preferred embodiment of the present invention is an SR-Latch. When MCLK 145 is running the output signal 165 of the MCSTAT detector 140 (hereinafter MCSTAT_N 165) is low and when it is not running MCSTAT_N 165 is high. The PCSTAT detector 135, which in the preferred embodiment is a simple state machine, detects the presence of the PCLK 150. When the PCLK 150 is not running the output signal 160 (hereinafter PCSTAT_N 160) from the PCSTAT detector 135 is high, and when PCLK 150 becomes active PCSTAT_N 160 stays at low for the next four MCLK 145 durations.

Figure 3:
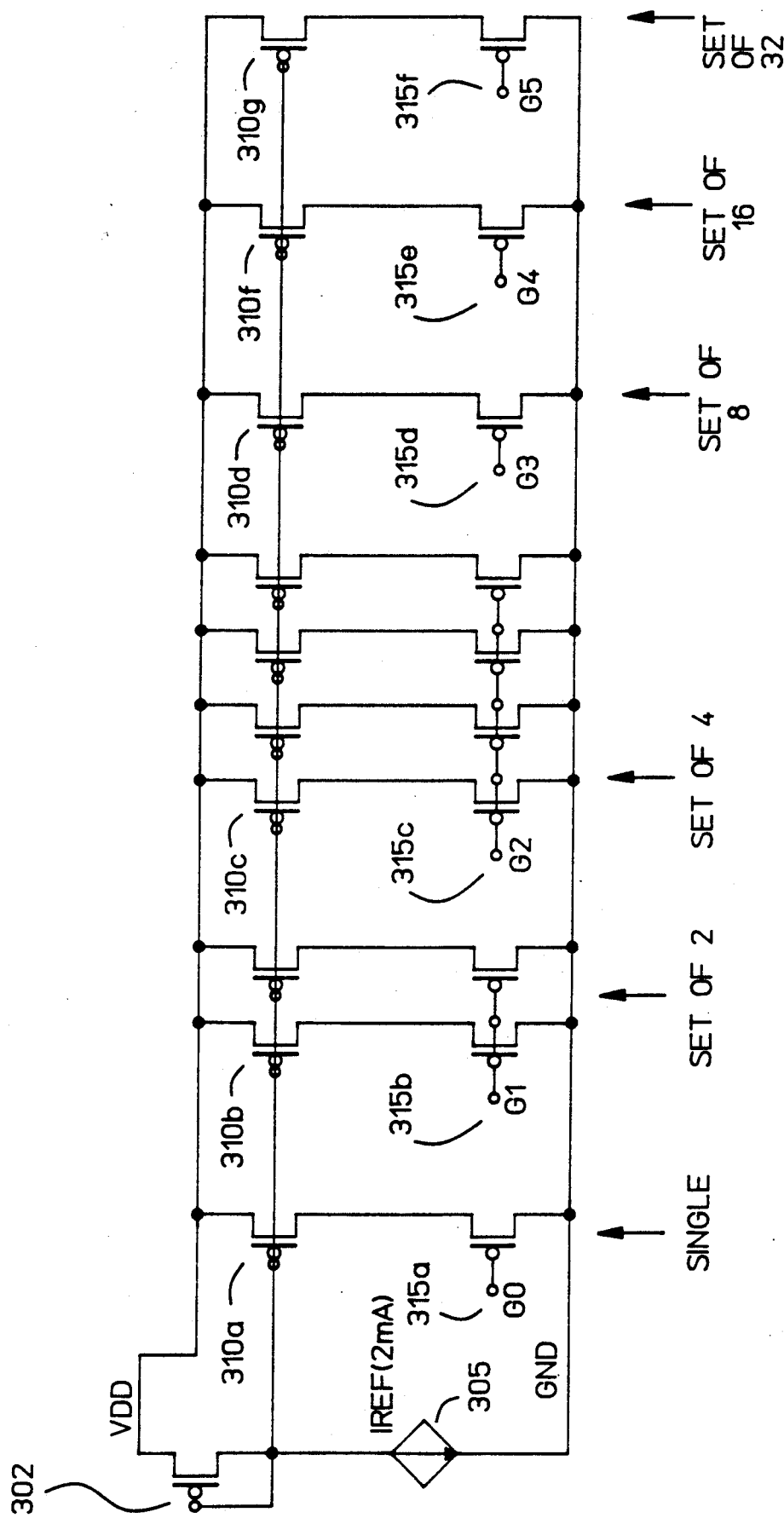
FIG. 3 shows a detailed example of the compensation heater that is controlled by the dynamic power compensation scheme of the present invention.

The compensation heater 170 is a binary weighted 64 bit wide (i.e., six controls) current mirror. A reference current of 2 mA is mirrored to the other 64 bits. These bits are then either turned on or off digitally. Since the preferred embodiment of the present invention is a 5 v system each bit provides 10 mW of compensation. The whole system is capable of providing 0 to 630 mW of additional power to the chip. The power provided to the chip can be changed by varying the current reference. A detailed illustration of the compensation heater 170 is shown in FIG. 3. Iref 305 is the reference current set at 2 mA and the voltage across the PMOS transistor 302 is mirrored at the PMOS transistors 310$a$, 310$b$, ..., 310$f$. VDD is set at 3 volts. G0 315$a$, G1 315$b$, ... G5 315$e$ are the digital controls that control the PMOS transistors. The weighting for the digital controls is G0=1, G1=2, G2=4, G3=8, G4=16, and G5=32. Thus, although G3 315$c$ only shows one transistor, the present invention actually has eight transistors at G3 315C.

Figure 4:
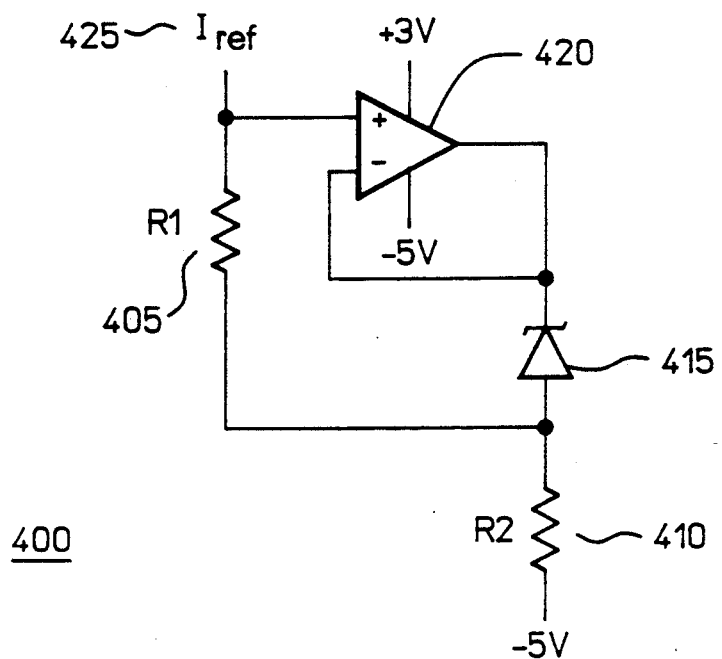
FIG. 4 shows a stable fixed current source to be utilized by the compensation heater.

One implementation of the present invention requires a stable fixed current source. FIG. 4 shows an example of how the current source Iref 305 in the compensation heater 170 can be implemented. The current source includes resisters R1 405 and R2 410, zener diode 415, and operational amplifier 420. Both resisters 405 and 410 have a temperature coefficient of less then 50 ppm/° C. In addition, the zener diode 415 also has a very low temperature drift (e.g. less then 50 ppm/° C.). The inverting input terminal of the op amp 420 is connected to the op amp's 420 output terminal and to the output of the zener diode 415. The zener diode acts as a voltage reference. The input of the zener diode 415 is connected through resistor R2 410 to a voltage source 425. The non-inverting input terminal of the op amp 420 is connected to a resistor R1 405 which is in turn connected to the input of the zener diode 415. The current across resistor R1 405 represents the current which is used by the compensation heater 170.

If a stable fixed current source is not required then all that is needed is for Iref to be connected to a resistor which in turn is connected to a −5 volt source. This forms the necessary current source, albeit with more variance per bit, for the compensation heater 170.

An alternative embodiment for providing a current source for the heater is an analog temperature sensing circuit with feedback to Iref 425. In FIG. 4, the zener diode 415 is a stable voltage reference with minimum temperature drift. The analog temperature sensing circuit has a voltage reference which is a true zener diode. A zener diode 415 having a known 10 mV/° C. voltage drift could be used instead of the zener diode used for the stable fixed current source described above. As the voltage across the zener diode 415 changes due to temperature fluctuation in the system, the voltage across resistor R1 505 will change, thus producing a change in Iref. The change to Iref is proportional to the temperature change. Consequently, an analog technique for compensating for ambient temperature drift is provided.

Figure 2:
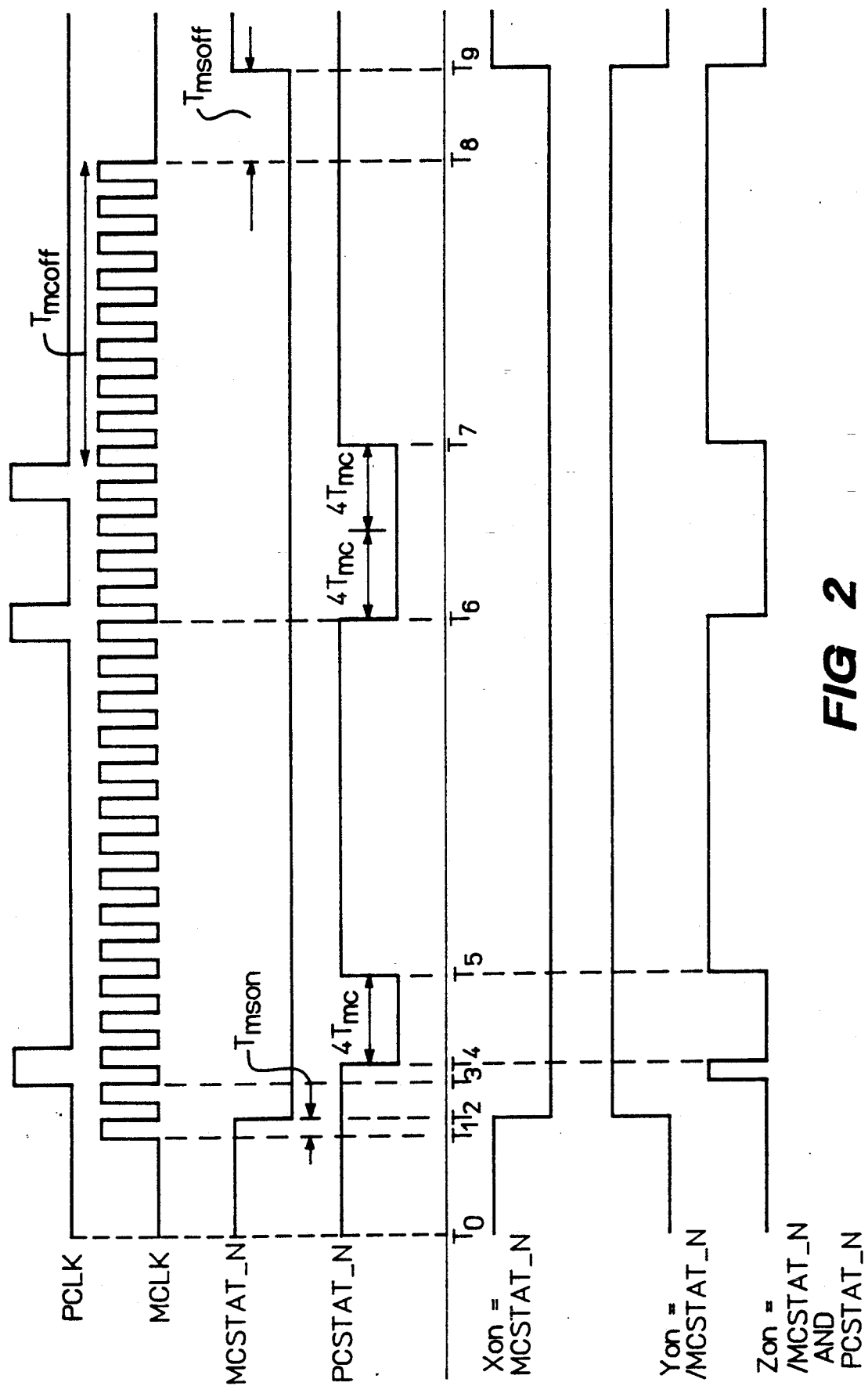
FIG. 2 shows a timing diagram for the dynamic power compensation system of the present invention.

Reference is made to FIG. 2, which shows a timing diagram for the dynamic power compensation system 100. FIG. 2 is a very specific example, whereas FIG. 7, described below, characterizes the operation of the dynamic power compensation system 100 more generally.

Initially, MCLK is not running and MCSTAT_N 165 is high, as shown at $t_0$. The maximum dynamic power should be programmed to the X register 105 so that the chip dissipates as much power as the maximum MCLK 145 and PCLK 150 operation. When MCLK 145 is not running, register X 105 is used to drive the temperature compensation heater 170. At this point in time, dynamic power of the chip is zero. Therefore, the sum of the dynamic power and compensation power is simply X.

Once Y and Z have been set using equations (2) and (3) above, MCLK 145 can be started at a specified frequency $F_{mc}$, as shown at $t_1$. When the MCLK 145 starts, MCSTAT detector 140 detects the presence of the MCLK 145 signal, and MCSTAT_N 165 goes low, as shown at $t_2$. At this point in time, PCLK 150 is not running, and thus PCSTAT_N 160 is still high. The minor delay associated between the start of the MCLK 145 and MCSTAT_N 165 going low is described below. Since PCSTAT_N 160 is high, the six bit gate 120 is open, and the Z value is added to the Y value by the adder 125; and since MCSTAT_N 165 is low, the input to the multiplexor 130 is low, and the multiplexor 130 output is switched from X to Y+Z. Consequently, Y+Z is given to the compensation heater 170.

When the PCLK 150 appears, as shown at $t_3$, PCSTAT_N 160 will be set to low, as shown at $t_4$, and the Z value will be gated off during the next 4 $T_{mc}$, as shown for example between $t_4$ and $t_5$. When MCLK 145 and PCLK 150 are running, the value located in register Y 110 is used to drive the temperature compensation heater 170. To reset MCSTAT 145, an attempt must be made to access the Y register 110 (i.e., address 71$h$). Any attempt to address the Y register 110 will switch the multiplexor's 130 output to the value located in X (but only momentarily if MCLK 145 is currently running).

When Z 115 is gated dynamically by PCLK 150, the average compensation power is:

$$P_{compen} = Y + P_{pccompen} = Y + Z\frac{\frac{F_{mc}}{4} - F_{pc}}{\frac{F_{mc}}{4}} =$$

$$Y + P_{pcmax}\frac{F_{pcmax} - F_{pc}}{F_{pcmax}}$$

At this time, dynamic power of the chip is:

$$P_{dyn} = P_{mcdyn} + P_{pcdyn} = P_{mcmax}\frac{F_{mc}}{F_{mcmax}} + P_{pcmax}\frac{F_{pc}}{P_{pcmax}} \quad (7)$$

Therefore, the sum of the dynamic power and compensation power is:

$$P_{dyn} + P_{compen} = P_{pcmax} + P_{pcmax} = X \quad (8)$$

As the PCLK 145 frequency is changed on the fly, the PCSTAT detector 135 takes care to maintain the power at a constant.

In the preferred embodiment of the present invention, a valid range of MCLK 145 and PCLK 150 frequency ratio is Fmc/Fpc=4 to 16,384. If we generalize this to Fmc/Fpc=M, PCSTAT_N 160 should be low (i.e., Z will be gated off) during next M*Tmc.

When MCLK 145 is stopped again, as shown at $t_8$, dynamic power is zero. However, the multiplexor 130 should be immediately switched to X value to avoid temperature variation. Because the thermal time constant of the chip is on the order of one second, several milliseconds is fast enough. If it took more than 100 ms, 5.0 second wait time is recommended to recover the chip temperature. The thermal time constants are shown in TABLE 1.

TABLE 1

| Parameter | min | typ | max |
|---|---|---|---|
| $T_{mson}$ | 0 | | 1 ms |
| $T_{msoff}$ | 0 | | 100 ms |
| $T_{mcoff}$ | | 40 $T_{mc}$ | |

Referring to FIG. 7, a general graph of the overall operation of the dynamic power compensation system and method of the present invention is shown. Generally, the chart plots power versus frequency. At a clock frequency of zero, the value in register X 105 needs to be loaded into the compensation heater 170 in order to maintain constant power. The chip operates over a known frequency range, which in the preferred embodiment is made up of two components: a master clock component and a period clock component. When the chip is not in a static condition, the present invention enables the Y and Z values accordingly.

For example, lets say the period clock is not running. In that case, the period clock dependent power $P_{pedyn}$ is zero. PCSTAT detector 135 controls so that the PCSTAT_N 160 signal stays high. Because there are no period clocks, PCSTAT_N 160 is always high and the dynamic power compensation system 100 uses the Y+Z value to compensate for the temperature change. As MCLK 145 frequency increases, the Y value gets smaller until the maximum MCLK 145 frequency is reached, at which point the Y value is shut off. As MCLK 145 frequency increases the chip provides more of the power and the compensation heater 170 has to provide less.

Because the MCLK 145 is a primary signal, it is not changed when the system is in critical analog operations. The Y value should be calculated properly and set in the memory device, before the MCLK 145 is started, and the frequency should not be changed during the system operation. On the other hand, period clock is an event trigger signal and its frequency or interval can be changed during the system operation. The PCSTAT detector 135 controls the system 100 so that the PCSTAT_N signal 160 stays low for four MCLK 145 durations after every PCLK 150. Thus, the Z value is not added to the heater for four MCLK 145 durations after every period clock event.

When the PCLK 150 is a divide by four of the MCLK 150 (which is the maximum period clock frequency) PCSTAT_N 160 stays low because it keeps the PCSTAT_N 160 signal low for four MCLK 145 durations at every PCLK 150. In that case, the period clock dependent power is $P_{pemax}$ which is the maximum period clock dependent power at the particular MCLK 145 frequency. Thus, the dynamic power compensation system 100 only uses the Y value to compensate for temperature change. When the PCLK 150 is less than divide by four, for example divide by eight, the PCLK 150 constitutes less of the power, and $P_{medyn}$ is smaller since the PCLK 150 is contributing less power. Consequently, the Z value must be combined with the Y value in order to compensate for the change in power. As the MCLK's 145 maximum frequency is approached, the Y value goes to zero. However, since the PCLK 150 is still not at it maximum frequency, the Z value must still contribute to the compensation scheme.

When the PCLK 150 is, as described above, a divide by eight of the MCLK 145, the PCSTAT detector 135 controls the system 100 so that PCSTAT_N 160 is low for four MCLK 145 durations and high for another four MCLK 145 durations. Thus, average power of the heater is Y+Z/2. As period clock frequency decreases, PCSTAT_N 160 stays at high state longer and a larger portion of the Z value contributes to the heater power. At the same time, as PCLK 150 frequency decreases, period clock dependent power decreases. The period clock dependent power and Z portion of the heater power compensate each other to maintain constant power dissipation. Even if the PCLK 150 fequency or interval changes very frequently, the PCSTAT detector 135 tracks the PCLK 150 interval and it keeps the average heater power to a complement of the PCLK 150 dependent power.

There are some variations to generate the MCSTAT_N signal 165. In the preferred embodiment, a SR-latch was used. When MCLK 150 starts, SR-latch automatically detects it and MCSTAT_N 165 will become low. This movement is very fast and any time differences between X value being switched to Y+Z and dynamic power coming up will not be noticed. When MCLK 145 stops, MCSTAT_N 165 should be reset by software. However, it may take a couple of milliseconds. Another way to generate the MCSTAT_N signal 165 is using an AC detector, lowpass filter, and a comparator to detect the MCLK 165 automatically. Choosing an appropriate filter time constant, it would be possible to control MCSTAT_N 165 on/off automatically without software control.

The present invention can also be implemented with only one clock, as opposed to using two clocks (i.e., MCLK 145 and PCLK 150). If only one clock was used, the state machine 135 and the adder 125 would no longer be necessary. In addition, only two registers would be necessary. The X register 105, which represents the maximum dynamic power value, would still be present, along with an additional register representing the single clock dependent power value. The clock dependent power value would depend upon the specific frequency the single clock is presently running at. The present invention can also be implemented with a plurality of asynchronous clocks, by using additional registers (representing the multiple clock values) and an adder that added n variables, where n is the number of asynchronous clocks.

Figure 5:
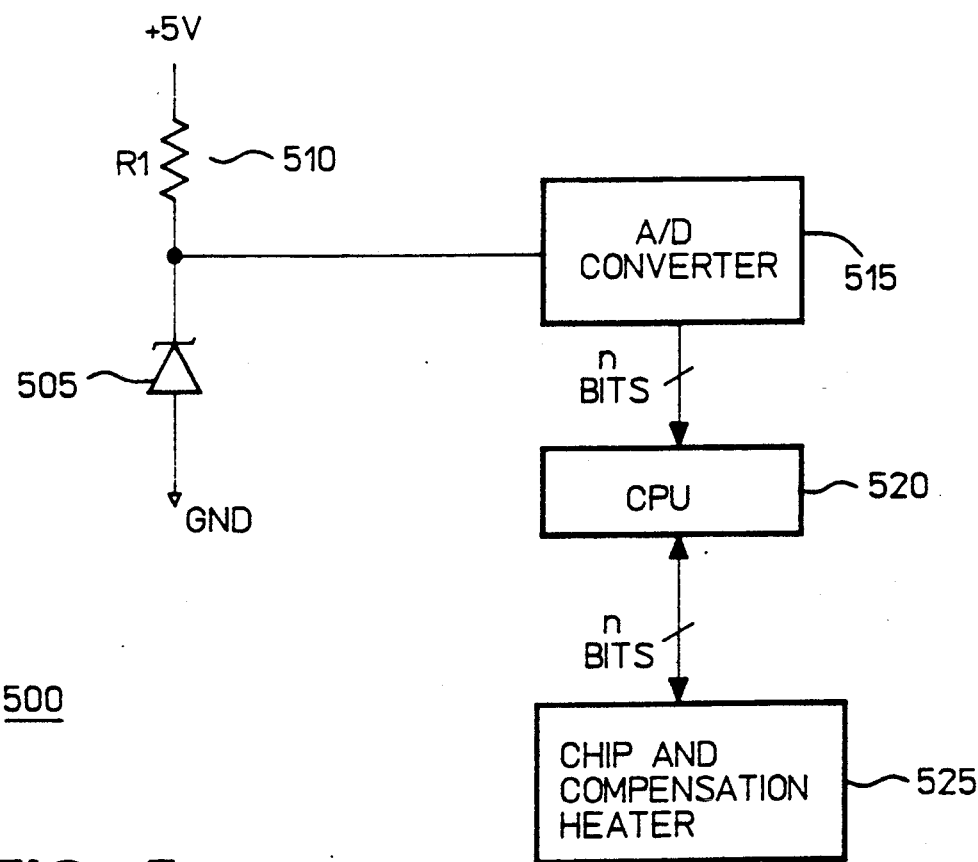
FIG. 5 shows an alternative embodiment for controlling the temperature on a chip by using an analog-to-digital conversion of temperature fluctuation.

FIG. 5 shows an additional method and apparatus for controlling the chip temperature on a chip containing CMOS devices. A zener diode 505 with a known 10 mV/° C. voltage drift is connected to resistor 510 which has a temperature drift of less than 5 ppm/° C. The resistor 510 acts as a current source. The output of the zener diode 505 is connected to an A/D converter 515. The voltage that is present at the input to the A/D converter 515 is proportional to the voltage in the zener diode 505. Thus as the voltage changes in the zener diode 505 due to temperature, the voltage value provided to the A/D converter will also change. The output from the A/D is connected to the input of a microprocessor 520. The microprocessor 520 reads the output from the A/D converter 515, and if it senses that there has been a drift in ambient temperature (i.e., change in voltage) in one direction or another it can adjust the X 105, Y 110, and Z 115 values accordingly in the compensation system 100 described above. Consequently, a digital technique for compensating for ambient temperature drift is provided. For example with a 9 bit A/D converter over a 5 volt range, each least significant bit of the A/D converter corresponds to a 1° C. temperature change. Thus, at calibration the A/D converter value is sampled. This value is stored and then new values are sampled every minute or so. If the new values deviate from the original then the temperature has changed and the compensation heater 170 needs to be adjusted accordingly.

Figure 6:
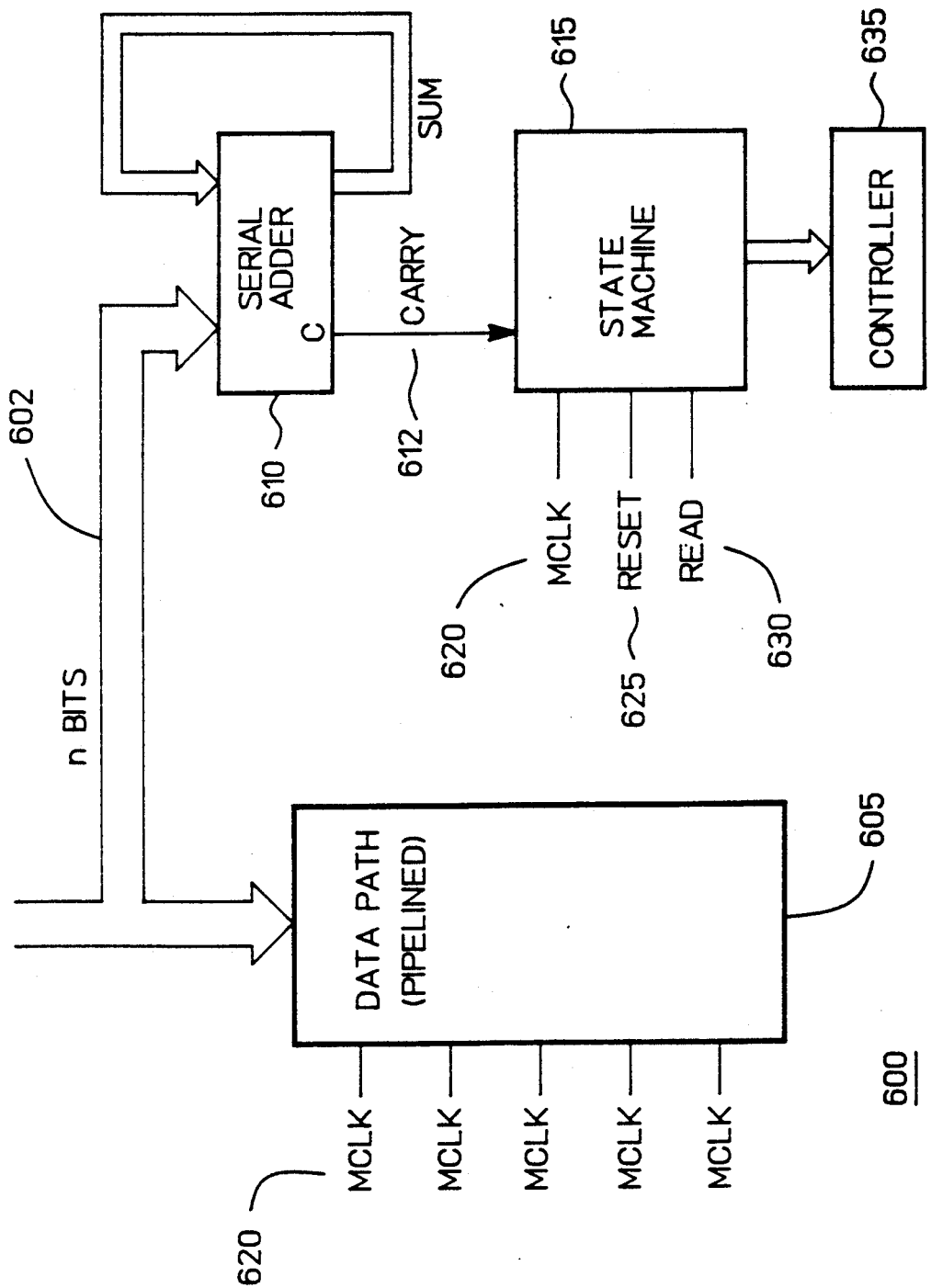
FIG. 6 shows an alternative embodiment for controlling temperature on a chip by monitoring data dependency.

FIG. 6 shows a yet another method and apparatus for controlling the value of the compensation heater control signals. The dynamic power compensation system 100 described above compensates for clock dependent power. An alternative/addition would be to compensate for data dependency. By examining the data stream from a data bus 602, a method and system is presented for controlling the temperature on a computer chip by observing the characteristics of that data stream. Given a data stream of ones and zeros, a series of alternating ones and zeros consumes the most power and a series of only ones or only zeros consumes the least. Thus, by observing the contents of the data streams entering the system, the power and thereby the temperature can be controlled.

Block 605 shows a traditional pipelined datapath. In a pipelined architecture operations occur on the data between successive clock cycles. The n bits of data that are used as input into the system 605 are also entered into an n bit serial adder 610. In the preferred embodiment each bit is given an equal weight (e.g., if we had an 8 bit data stream then bit 7, which would be the Most Significant Bit, would have the same weight as say bit 0). However, an alternative embodiment would include a serial adder which would assign a unique weight to individual bits which are utilized more frequently.

A serial addition is performed on the bits entering the serial adder 610 for a given amount of MCLK 620 cycles. The carry from the serial adder 610 is connected to the input of a state machine 615 which counts the number of carries for a specified number of clock pulses. Everytime a one is followed by a zero or vice versa in the data stream the carry from the adder 610 will be a one. The state machine 615 will keep track of the number of ones and zeros from the carry signal. The number of ones and zeros are averaged at 635, and this value is used to adjust the heater control information signals X, Y, and Z, and thereby the temperature on the chip can be controlled. Once the compensation heater 170 has been adjusted the state machine 615 is reset 625 and the procedure repeated.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A system for controlling dynamic power variation on a chip, comprising:
    (a) control means for monitoring at least one clock pulse employed by the chip, and providing a control signal indicative of a state of said at least one clock pulse;
    (b) a memory unit containing at least one heater control information value, wherein said at least one heater control information value is a function of said at least one clock pulse;
    (c) selector means, responsive to said control signal, for selecting at least one heater control information value from said memory unit; and
    (d) heater means for controlling the temperature on the chip in accordance with said selected at least one heater control information value.

2. The system of claim 1, wherein said control means comprises signal means for generating said control signal from said at least one clock pulse.

3. The system of claim 1, further comprising (d) adder means for adding two or more of said at least one heater control information values.

4. The system of claim 1, further comprising means for evaluating ambient temperature fluctuation on the chip, comprising:
    (d) a voltage reference with a known temperature coefficient;
    (e) an A/D converter connected to said voltage reference;
    (f) evaluation means for comparing said A/D converter output with the temperature at a calibration point;
    (g) adjustment means for adjusting said at least one heater control information value in accordance with said ambient temperature fluctuation.

5. The system of claim 1, wherein said heater means comprises a current mirror with a stable fixed current source.

6. The system of claim 1, wherein said heater means comprises a current mirror with an analog temperature sensing circuit with feedback to a current source of said heater means.

7. A system for controlling dynamic power variation on a chip, comprising:
    (a) control means for evaluating temperature conditions on the chip, and providing a control signal indicative of said temperature condition, said control means having,
        (1) a serial adder, connected to a data bus on the chip;
        (2) a state machine, connected to the carry output of said serial adder, said state machine configured to monitor the carry output of said serial adder for a change in value; and
        (3) adjustment means, responsive to the output of said state machine, for generating said control signal;
    (b) selector means, responsive to said control signal, for selecting at least one heater control information value; and
    (c) heater means for controller the temperature on the chip in accordance with said at least one heater control information value.

8. The system of claim 7 wherein said serial adder assigns a unique weight to each bit of data.

9. A system for controlling dynamic power variation on a chip, comprising:
    (a) control means for evaluating temperature conditions on the chip, and providing a control signal indicative of said temperature condition;
    (b) selector means, responsive to said control signal, for selecting at least one heater control information value; and
    (c) heater means for controlling the temperature on the chip in accordance with said at least one heater control information value;
    (d) first, second, and third registers containing first, second and third heater control information signals;
    (e) adder means having a first input coupled to an output of said first register;

(f) a control gate having a first input coupled to an output of said third register and an output coupled to a second input of said adder means;

(g) wherein said control means, comprises:

(i) a first input control signal detector having an output coupled to a second input of said control gate; and (ii) a second input control signal detector;

(h) means for providing a first input signal, having first and second states, to an input of said second input control signal detector;

(i) said selector means comprising a multiplexer having a first input coupled to an output of said first register, a second input coupled to an output of said adder and an output coupled to said heater means;

(j) said second input control signal detector having an output coupled to a third input of said multiplexer; and (k) means for providing a second input signal, different from said first input signal and having first and second states, to an input of said first input control signal detector;

wherein:

when said first input signal is in its first state, only the control information signal in said first register is passed through said multiplexer to said heater means, when said first input signal is in its second state and said second input signal is in its second state, only the control information signal in said second register is passed through said multiplexer to said heater means, and when said first input signal is in its second state and said second input signal is in its first state, only the sum of the information signals in said second and third registers is passed through said multiplexer to said heater means.

10. A system for controlling temperature on a chip having at least one clock, comprising:

(1) means for driving a compensation heater with a maximum dynamic power value to effectively maintain the temperature on the chip if the at least one clock is in a first state;

(2) evaluator means for evaluating the chip for temperature fluctuation; and (3) adjustment means for adjusting said compensation heater, in response to said temperature fluctuation, with at least one compensation power value if the at least one clock is in a second state.

11. A method of controlling temperature on a chip having at least one clock, comprising the steps of:

(1) driving a compensation heater with a maximum dynamic power value to effectively maintain the temperature on the chip if the at least one clock is in a first state;

(2) evaluating the chip for temperature fluctuation; and (3) compensating for said temperature fluctuation by driving said compensation heater with at least one compensation power value if the at least one clock is in a second state.

12. The method of claim 11, further comprising the step of storing said maximum dynamic power value and said at least one compensation power value in a register contained in a memory device.

13. The method of claim 11, further comprising the step of adding multiple compensation power values together and providing the result of said addition to said compensation heater.

14. The method of claim 11, wherein said compensating of step (3) is performed in real-time.

15. The method of claim 11, further comprising the steps of:

(4) providing at least one clock pulse; and (5) monitoring said at least one clock pulse for a change in state.

16. The method of claim 12, wherein said step (3) of compensating is a function of said at least one clock pulse.

17. A method for controlling dynamic power variation on a chip, comprising:

(1) evaluating temperature conditions on the chip;

(2) generating at least one clock pulse;

(3) representing said at least one clock pulse as a heater control information value, wherein said heater control information value is a function of said at least one clock pulse;

(4) storing said heater control information value in memory; and (5) providing said heater control information value to a compensation heater.

18. The method of claim 17, further comprising the step of driving said compensation heater with a stable fixed current source.

19. The method of claim 17, further comprising the step of evaluating the chip for fluctuation in ambient temperature drift.

20. The method of claim 19, wherein said evaluating step comprises driving said compensation heater with an analog temperature sensing circuit with feedback to the current source of said compensation heater.

21. A system for controlling dynamic power variation on a chip, comprising the steps of:

(1) evaluating temperature conditions on the chip; and (2) providing a heater control information value to a compensation heater, wherein said heater control information value is a function of said temperature conditions on the chip;

wherein said step (1) of evaluating includes, (a) serially adding data from a data bus located on the chip;

(b) monitoring a carry output of said serial addition; and (c) adjusting said heater control information value based on said carry output.

22. A system for controlling dynamic power variation on a chip, comprising the steps of:

(1) evaluating temperature conditions on the chip; and (2) providing a heater control information value to a compensation heater, wherein said heater control informataion value is a function of said temperature conditions on the chip;

wherein said step (1) includes the steps of, (a) generating first and second input control signals, each having first and second states; and (b) storing in memory first, second, and third heater control information signals that are a function of said first and second input control signals; and wherein said step (2) includes the steps of, (a) providing only said first heater control information signal to the heater when said first input control signal is in its first state;

(b) providing only said second heater control information signal to the heater when said first input control signal is in its second state and said second input control signal is in its first state; and
(c) providing only a combination of said second and third heater control information signals to the heater when said first input control signal is in its second state and said second input control signal is in its second state.

23. A system for controlling dynamic power variation on a chip having at least one clock, comprising:
(a) monitoring means for monitoring at least one clock pulse in order to evaluate temperature conditions on the chip;
(b) selection means, responsive to said monitoring means, for selecting at least one of at least two heater control values, wherein said at least two heater control values are stored in at least two registers; and
(c) heater means for controlling said temperature conditions on the chip in accordance with said selected heater control value(s).

24. The system of claim 23, wherein said monitoring means monitors a first clock pulse and a second clock pulse in order to evaluate temperature conditions on the chip, wherein the system further comprises a first register, a second register, and a third register for storing a first heater control value, a second heater control value, and a third heater control value, respectively, wherein said first heater control value is associated with the dependent power associated with said first clock pulse, said second heater control value is associated with the dependent power associated with said second clock pulse, and said third heater control value is associated with the sum of the maximum dependent power of said first clock pulse and the maximum dependent power of said second clock pulse, and
wherein said heater means is controlled by at least one of said first heater control value, said second heater control value, and said third heater control value.

25. The system of claim 24 further comprising:
(d) an adder having a first input coupled to an output of said first register;
(e) a control gate having a first input coupled to an output of said second register and an output coupled to a second input of said adder means;
(f) wherein said control means, comprises:
  (i) a first input control signal detector having an output coupled to a second input of said control gate; and
  (ii) a second input control signal detector;
(g) means for providing said first clock pulse, having first and second states, to an input of said first input control signal detector and said input control signal detector;
(h) said selector means comprising a multiplexer having a first input coupled to an output of said third register, a second input coupled to an output of said adder and an output coupled to said heater means;

(i) said second input control signal detector having an output coupled to a third input of said multiplexor; and
(j) means for providing said second clock pulse, different from said first clock pulse and having first and second states, to an input of said first input control signal detector;
wherein:
when said first clock pulse is in its first state, only said third heater control information value in said third register is passed through said multiplexer to said heater means,
when said first clock pulse is in its second state and said second clock pulse is in its first state, only the sum of said heater control values in said first and second registers is passed through said multiplexer to said heater means, and
when said first clock pulse is in its second state and said second clock pulse is in its second state, only said heater control value in said first register is passed through said multiplexer to said heater means.

26. The system of claim 24, wherein said third heater control value is defined as:

$$X = P_{pcmax} + P_{mcmax}$$

wherein $P_{pcmax}$ is the dependent power associated with said second clock pulse and $P_{mcmax}$ is the dependent power associated with said first clock pulse.

27. The system of claim 24, wherein said first heater control value is defined as:

$$Y = (P_{pcmax} + P_{mcmax}) \frac{F_{mcmax} - F_{mc}}{F_{mcmax}}$$

wherein $P_{pcmax}$ is the dependent power associated with said second clock pulse, $P_{mcmax}$ is the dependent power associated with said first clock pulse, $F_{mcmax}$ is the maximum frequency of said first clock pulse and $F_{mc}$ is the frequency of said first clock pulse.

28. The system of claim 24, wherein said second heater control value is defined as:

$$Z = Z_{pcmax} \frac{F_{mc}}{F_{mcmax}} = P_{pcmax} \frac{F_{mc}}{F_{mcmax}}$$

wherein $P_{pcmax}$ is the dependent power associated with said second clock pulse, said $P_{mcmax}$ is the dependent power associated with said first clock pulse, said $F_{mcmax}$ is the maximum frequency of said first clock pulse, $F_{mc}$ is the frequency of said first clock pulse.

29. A method for controlling dynamic power variation on a chip, comprising:
(1) monitoring at least one clock pulse employed by the chip;
(2) representing said at least one clock pulse as at least one heater control information value, wherein said heater control information value is a function of said at least one clock pulse; and
(3) providing said at least one heater control information value to a compensation heater.

* * * * *